United States Patent [19]

Nguyen et al.

[11] Patent Number: 5,665,620
[45] Date of Patent: Sep. 9, 1997

[54] METHOD FOR FORMING CONCURRENT TOP OXIDES USING REOXIDIZED SILICON IN AN EPROM

[75] Inventors: Bich-Yen Nguyen; Sergio A. Ajuria; Wayne Paulson; Jon Dahm, all of Austin, Tex.

[73] Assignee: Motorola, Inc., Schaumburg, Ill.

[21] Appl. No.: 283,364

[22] Filed: Aug. 1, 1994

[51] Int. Cl.[6] ............................................. H01L 21/8247
[52] U.S. Cl. .......................... 438/593; 438/594; 438/265; 438/266
[58] Field of Search .................. 437/43, 52, 238, 437/239, 978

[56] References Cited

U.S. PATENT DOCUMENTS

| | | | |
|---|---|---|---|
| 4,179,311 | 12/1979 | Athanas . | |
| 4,722,909 | 2/1988 | Parrillo et al. | 437/34 |
| 4,745,086 | 5/1988 | Parrillo et al. | 437/57 |
| 4,748,133 | 5/1988 | Griswold | 437/43 |
| 5,104,819 | 4/1992 | Freiberger et al. | 437/43 |

FOREIGN PATENT DOCUMENTS

| | | | |
|---|---|---|---|
| 3340583A1 | 5/1984 | Germany | 437/239 |
| 2-28250 | 6/1990 | Japan | 437/239 |
| WO8705152 | 8/1987 | WIPO | 437/239 |

*Primary Examiner*—John Niebling
*Assistant Examiner*—Richard A. Booth

[57] ABSTRACT

A stack of oxide (16) and silicon nitride (18) is grown/deposited over a patterned polysilicon line, which typically acts as a bottom capacitor plate. A thin layer of amorphous or polycrystalline silicon (20) is deposited over the blanket silicon nitride film. The thickness of the deposited silicon layer must be optimized according to the final amount of oxide desired over the silicon nitride, which will be roughly twice the thickness of the deposited silicon film. The oxide/nitride/silicon stack is then patterned and etched, stopping either at or underneath the bottom oxide. Any subsequent cleaning in potentially oxide-etching chemistries (including HF) is done with the protective silicon deposit on top of the silicon nitride. The entire structure is then thermally oxidized, transforming the deposited silicon into silicon oxide (30). Where the structure has been cleared down to the substrate by etching, a second gate oxide is simultaneously formed.

20 Claims, 3 Drawing Sheets

METHOD FOR FORMING CONCURRENT TOP OXIDES USING REOXIDIZED SILICON IN AN EPROM

CROSS-REFERENCE TO RELATED APPLICATION

Related material is disclosed in a patent application by Vidya Kaushik et al., entitled "Method for Forming a Reverse Sequence Dielectric Stack," filed concurrently herewith and assigned to assignee hereof.

FIELD OF THE INVENTION

The present invention relates generally to a semiconductor device and more specifically to a method for contemporaneously forming an ONO stack and a second gate oxide by reoxidizing silicon.

BACKGROUND OF THE INVENTION

A stack of oxide/nitride/oxide (ONO) is used as an interpolysilicon dielectric in a semiconductor device. The current method of forming the ONO stack involves first growing a thermal oxide over polysilicon. Then a nitride is deposited overlying the thermal oxide. After the nitride is deposited, either the top surface of the nitride is oxidized, or an oxide is deposited overlying the nitride. However, because devices are being scaled down due to the trend in miniaturization, the nitride layer is becoming thinner which poses the problem of nitride punch-through after successive oxidations. Furthermore, the thickness of the top oxide is limited when a nitride oxidation process is used due to the inherently slow oxidation kinetics of the nitride. Additionally, since the oxidation rate of nitride is slow and the oxidation temperature required is high, the thermal budget of the device limits the amount of oxidation that the nitride can undergo. If a thick top oxide is required, the current method uses a chemical vapor deposition (CVD) process to deposit the top oxide. However, the deposited CVD oxide is less dense than what is required, so an annealing step must be performed to densify the top oxide. This additional densification step must be performed at a high temperature, and again the thermal budget of the device constrains the mount of annealing that can be done.

The top oxide layer is important for the electrical performance of the device. However, this top oxide is exposed to a hydrofluoric acid solution (HF) during the second gate oxide formation which is detrimental to the device since the top oxide may be partially or completely removed during the etching steps.

Accordingly, a need exists for a method to form a top oxide that mimimizes the problem of nitride punch-through as well as the etching of the top oxide during HF exposure prior to second gate oxide formation.

BRIEF DESCRIPTION OF THE DRAWINGS

The various figures illustrate many of the same or substantially similar elements. Therefore, same or substantially similar elements are labeled using the same reference numerals in the figures accompanying the description.

DETAILED DESCRIPTION OF A PREFERRED EMBODIMENT

Figure 1:
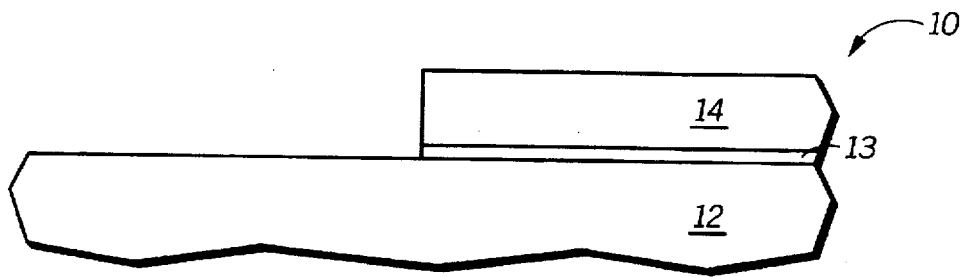
FIGS. 1–6 illustrate, in cross-section, process steps for making concurrent top oxides in accordance with the invention.

The present invention provides, in one embodiment, a method for making an ONO stack and a second gate oxide contemporaneously. Layers of oxide and nitride are formed overlying a semiconductor substrate which has already undergone some processing, such as isolation, well formation, first gate oxide formation, and/or tunnel oxide formation. A polysilicon floating gate overlying this semiconductor substrate is formed by depositing, patterning, and etching a polysilicon layer. Then, first and second dielectric layers are formed overlying the floating gate and the semiconductor substrate. Next a layer of amorphous silicon is formed overlying the dielectric layers to create a stack. This stack is then defined and etched to form a patterned stack, wherein a portion of the underlying semiconductor substrate is exposed. A thermal oxidation process is performed to reoxidize the amorphous silicon layer to form the ONO stack, while concurrently forming a second gate oxide on the exposed portion of the underlying semiconductor substrate. The second dielectric layer acts as an oxidation stop so that only the amorphous silicon layer in the stack is reoxidized during the thermal oxidation process. Once oxidation of the amorphous silicon layer is complete, the thickness of the second gate oxide can be independently adjusted, so that two different oxide thicknesses may be obtained through a single thermal oxidation step.

Alternatively, the amorphous silicon layer may be deposited after the first and second dielectric layers are defined and etched. In this embodiment, a conformal layer of amorphous silicon is formed which is then reoxidized in the thermal oxidation step thus forming polyoxide on the top and sidewalls of the patterned stack, as well as on the exposed substrate. The reoxidized amorphous silicon may be removed from the top of the patterned stack leaving spacers on the sidewalls of the stack. The polysilicon sidewall spacer on the nitride liner can be oxidized to form an inflatable side spacer which can be removed without damaging the underlying substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

FIGS. 1–6 illustrate, in cross-section, process steps for making concurrent top oxides and gate oxides in accordance with the invention. A semiconductor substrate 12 is provided, wherein this substrate is preferably silicon which may have gone through previous processing steps, such as isolation, well formation, first gate oxide 13 formation, and/or tunnel oxide formation. Other process steps not specifically mentioned may also have been performed on this substrate. A floating polysilicon gate 14 overlying a portion of the semiconductor substrate 12 is then formed by the patterning and etching of a low pressure chemical vapor deposition (LPCVD) polysilicon layer.

Figure 2:
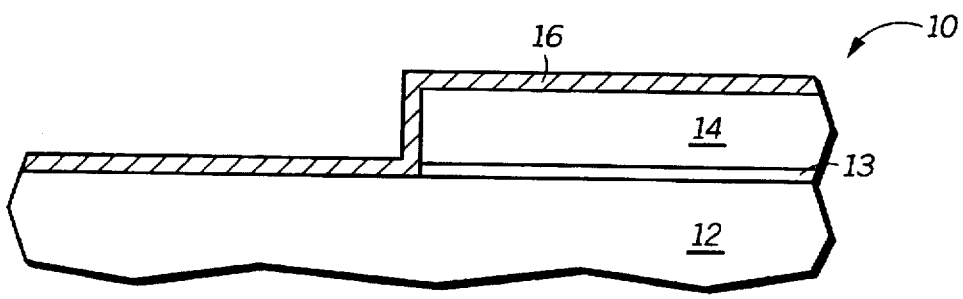

Once the polysilicon gate 14 is formed, then a first dielectric layer 16 is formed overlying the gate 14 as well as the exposed portion of the substrate 12 as illustrated in FIG. 2. The first dielectric layer 16 is typically an oxide, having a thickness substantially in a range of 50 to 200 angstroms (Å). It may be formed either by CVD or by oxidizing a portion of the polysilicon gate 14.

Figure 3:
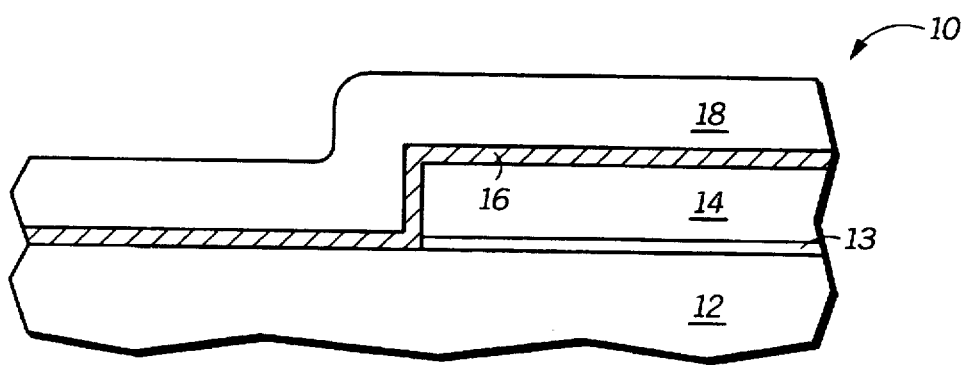

FIG. 3 illustrates a next step in the process where a second dielectric layer 18 is formed overlying the first dielectric layer 16. This second layer 18 is typically a nitride, having a thickness substantially in a range of 60Å to 200Å. This layer may be formed by CVD or some other suitable method, such as plasma enhanced nitride. It is important that this second dielectric layer 18 be of a minimum thickness so that it can act as an effective oxidation stop for a subsequent process step to prevent punch-through. Moreover, this second dielectric layer 18 should preferably be different from the first dielectric layer 16 and should be an oxidation resistant material.

Figure 4:
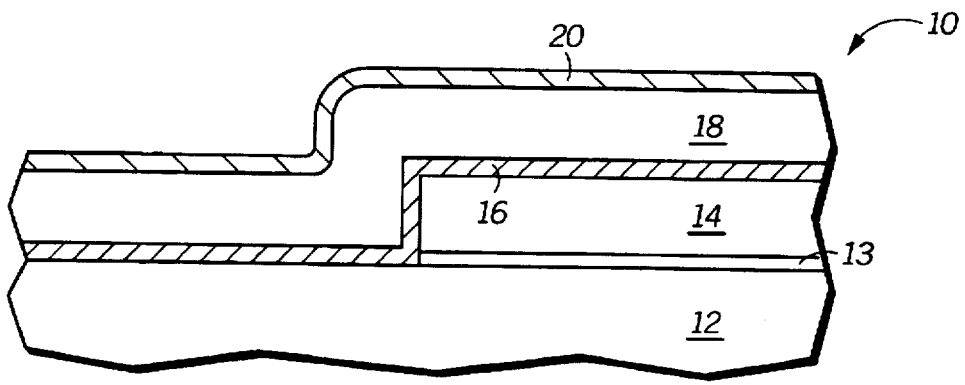

Once the second dielectric layer 18 is formed, then an amorphous silicon layer 20 may be deposited overlying the second dielectric layer 18, as illustrated in FIG. 4. A stack of amorphous silicon, second dielectric, and first dielectric is formed. Although there is no limit to the thickness of this amorphous silicon layer 20, it should be formed with several considerations in mind. If there is a constraint on the net or total thickness of the desired stack, then depending on what the thicknesses of the first and second dielectric layers 16 and 18 are, the amorphous silicon layer 20 should have a thickness equal to approximately one-half of the remaining difference. The reason for this requirement will become apparent in the thermal oxidation step of FIG. 6. Of course, if there is no constraint on the top oxide thickness or if a thick top oxide is desired, such as for a chemical mechanical polishing process, the amorphous silicon layer may be formed to any suitable thickness. The amorphous silicon layer 20 may be deposited with CVD technology using either disilane ($Si_2H_6$) or silane ($SiH_4$). The deposition temperature may range from either 400° to 550° C. for disilane or from 500° to 560° C. for silane. Alternatively, it is also possible to use a plasma-enhanced CVD to form the amorphous silicon layer 20.

Figure 5:
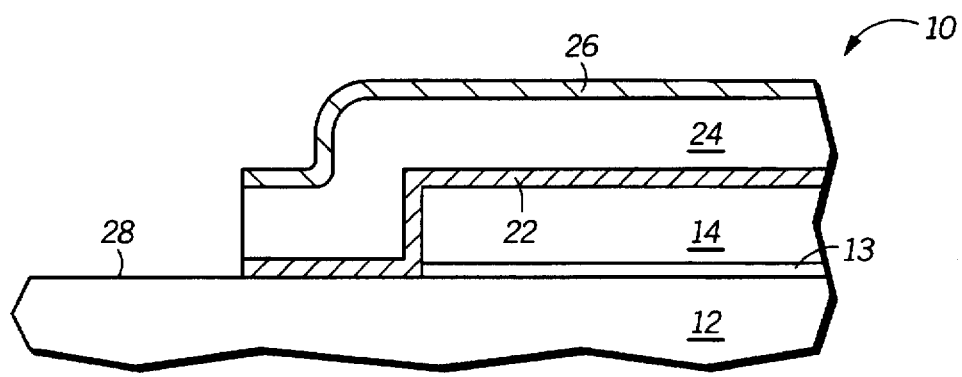

FIG. 5 illustrates a subsequent step after the amorphous silicon layer 20 is deposited. The entire stack of amorphous silicon, second dielectric, and first dielectric is defined and etched to form a patterned stack. Several etches may be required to pattern the various materials in the stack. For example, a first etch may be used to remove the amorphous silicon to leave a patterned amorphous silicon portion 26. Then a second etch may be used to remove the second and first dielectrics, leaving a patterned second dielectric portion 24, and a patterned first dielectric portion 22. In this embodiment, the floating polysilicon gate 14 has already been etched prior to the formation of the stack. However, it is also possible to etch the polysilicon gate 14 during this etching step after the second and first dielectrics have been patterned. After the stack has been defined and etched, a portion 28 of the underlying semiconductor substrate 12 is exposed.

Figure 6:
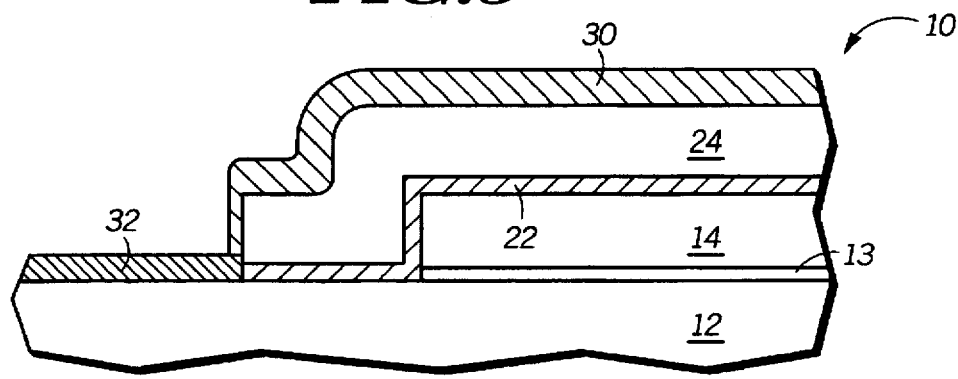

In FIG. 6, a thermal oxidation step is performed which reoxidizes the patterned amorphous silicon portion to form a silicon dioxide 30 and contemporaneously forms the second gate oxide 32 over the exposed portion 28 of the semiconductor substrate 12. This thermal oxidation may be accomplished using either conventional 1 atmosphere oxidation, rapid thermal oxidation, or high pressure oxidation equipment at a temperature approximately in the range of 700° to 1050° C. This temperature range may be varied according to the type of equipment used and the thickness of the amorphous silicon layer. The second dielectric portion 24 acts as an oxidation stop once the amorphous silicon portion is fully reoxidized. Therefore, it is important that this second dielectric portion be sufficiently thick to prevent punch-through of the second dielectric. Alternatively, the thermal oxidation or the amorphous silicon should be performed at a temperature lower than the temperature required to oxidize the second dielectric material. Once the reoxidation is complete, the resulting top oxide layer 30 has grown to approximately twice the thickness of the original amorphous silicon layer. Therefore, this phenomenon should be taken into account when determining the appropriate thickness for the amorphous silicon layer deposition. An advantage to this method of forming the top oxide is that no densification or annealing step is required because the quality of this thermal oxide is better than that of a CVD oxide. A small amount of sidewall oxide may be formed during the oxidation process, but this amount is typically negligible.

In addition to the completion of the formation of the dielectric stack, the second gate oxide 32 is formed during the same thermal oxidation step thus saving another step in the device fabrication process. This gate oxide 32 is formed by oxidizing the exposed portion 28 of the semiconductor substrate 12. Because the second dielectric portion 24 acts as an oxidation stop for the reoxidation of the amorphous silicon, the thickness of the gate oxide 32 may be formed independently of the silicon dioxide 30 thickness. Once the amorphous silicon is fully reoxidized, the oxidation stops on that portion of the substrate while the second gate oxide may continue to be grown.

Figure 7:
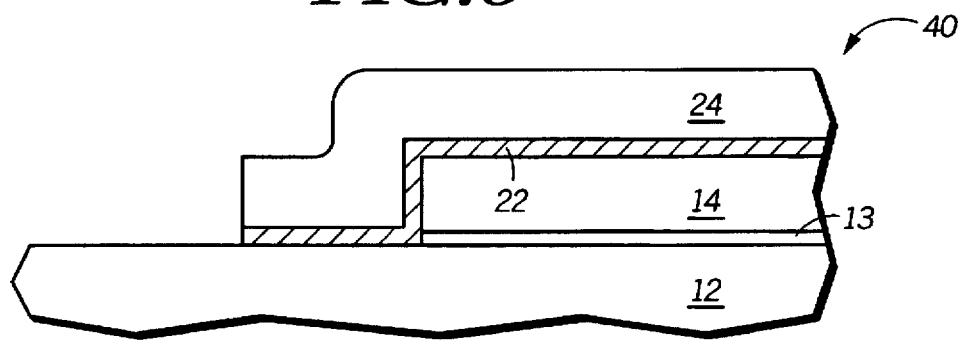
FIGS. 7–9 illustrate, in cross-section, process steps for making a conformal top oxide layer in accordance with the invention.
Figure 8:
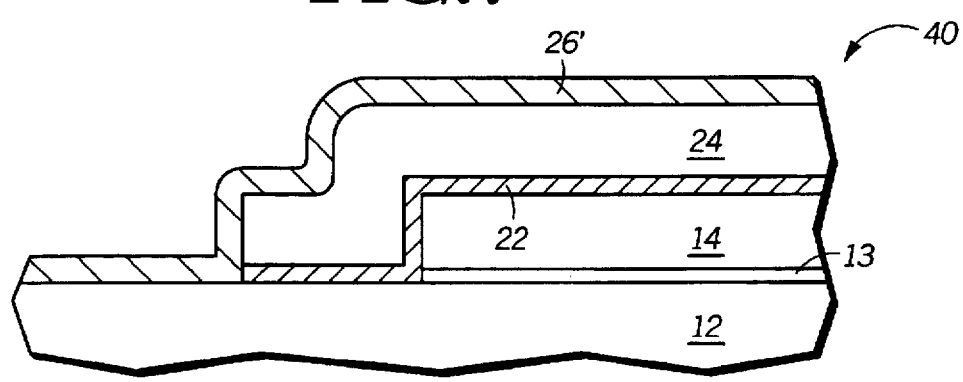
Figure 9:
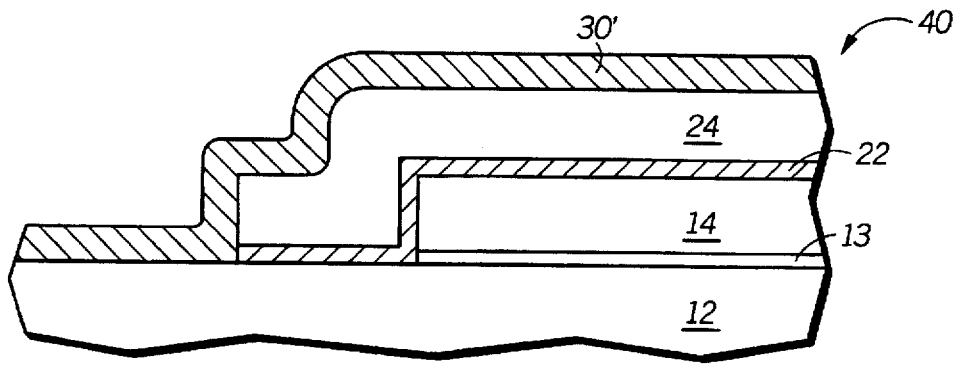

FIGS. 7–9 illustrate, in cross-section, process steps for making a conformal top oxide layer in accordance with another embodiment of the invention. In this method, the first three steps are the same as that of FIGS. 1–3 of the previous embodiment. However, the stack of the second and first dielectric layers is defined and etched prior to the deposition of the amorphous silicon layer as shown in FIG. 7. After the patterning of the stack, then a conformal amorphous silicon layer 26' is deposited overlying the patterned stack and the exposed portion of the substrate 12 as illustrated in FIG. 8. The thermal oxidation step in FIG. 9 forms a conformal top oxide layer 30' overlying the patterned stack and the remaining portion of the substrate. Additionally, the sidewall of the stack is covered with the oxide material whereas the previous embodiment does not provide significant sidewall coverage. This sidewall coverage produces a fully oxide-encapsulated layer that can reduce lateral leakage currents and improve the performance of the device. Furthermore, the second gate dielectric is a stacked oxide that ensures misalignment of micro-defects in the various layers.

A variation of the immediately preceding embodiment is also possible, although not specifically illustrated, the main difference being that the polysilicon layer is etched along with the dielectric layers instead of being predefined. In this embodiment, a polysilicon layer overlying a gate or tunnel oxide is first formed using CVD techniques. This is followed by a first dielectric layer, typically an oxide in the range of 50Å to 200Å. A second dielectric layer is formed overlying the first dielectric layer. The second dielectric layer is typically a nitride having a thickness in the range of 60Å to 200Å. This second layer is formed by CVD or other suitable method. The second dielectric/first dielectric/polysilicon stack is now patterned and etched to form a patterned stack of nitride, oxide, and gate polysilicon and to expose a portion of the underlying patterned substrate. A conformal amorphous silicon layer is formed overlying the patterned stack and the portion of the patterned substrate. This conformal amorphous silicon layer is then thermally oxidized to convert the amorphous silicon layer into a thermal oxide layer. This thermal oxide layer covers the top and sidewalls of the stack as well as forming a second gate oxide. The thickness of the top oxide and sidewall oxides are controlled by the amorphous silicon thickness.

Figure 10:
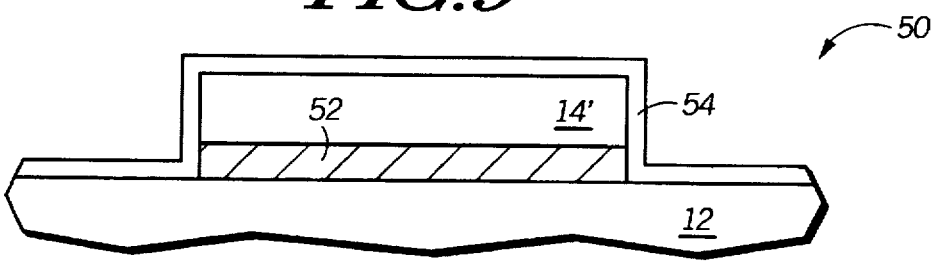
FIGS. 10–13 illustrate, in cross-section, process steps for making an inflatable sidewall spacer in accordance with the invention.

FIGS. 10–13 illustrate, in cross-section, process steps for making an semiconductor device 50 having an inflatable sidewall spacer 56 in accordance with yet another embodiment of the invention. As illustrated in FIG. 10, a polysilicon gate 14' is formed overlying the semiconductor substrate 12. A first dielectric layer 52 separates the polysilicon gate 14' from the underlying substrate 12. This dielectric layer may be a nitride or an oxide or any other suitable dielectric material which has high oxidation resistance. A second dielectric layer 54 surrounds the polysilicon gate 14'. This second dielectric layer is typically a nitride but could also be any other suitable dielectric material. As an optional step, N– and P– implants (not shown) can now be done to form lightly doped drain (LDD) junctions in the substrate. Methods of forming the polysilicon gate, the first and second dielectric layers, and implants are known in the art.

Figure 11:
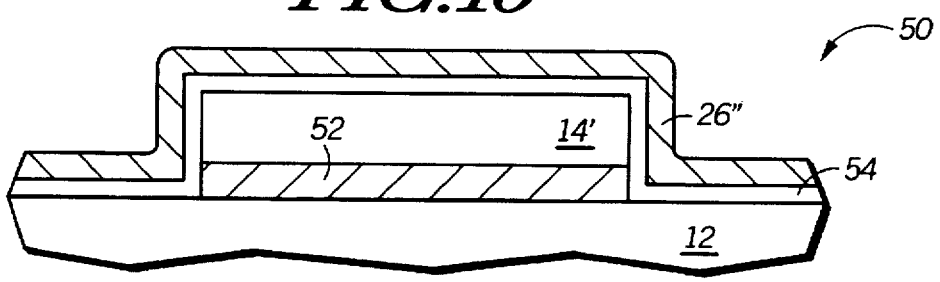
Figure 12:
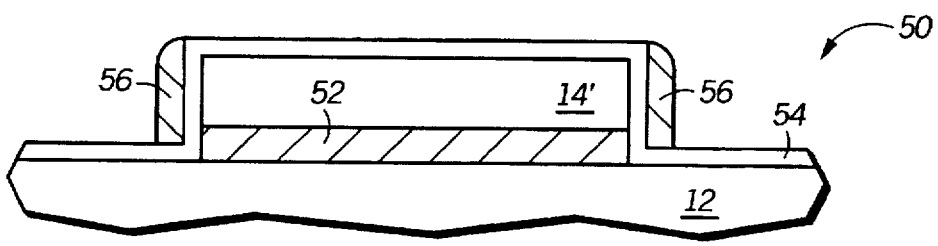
Figure 13:
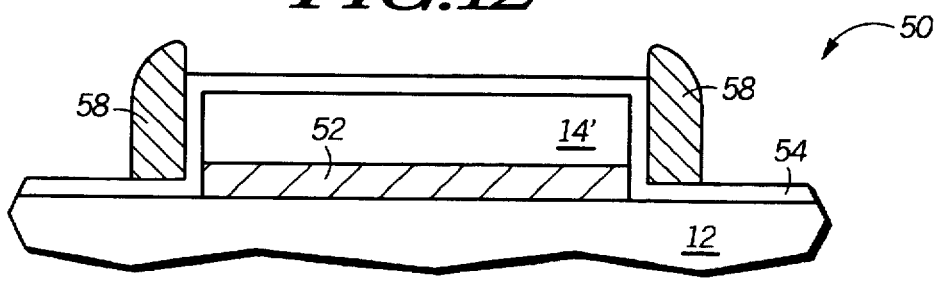

In FIG. 11, a layer of doped or undoped amorphous silicon 26" is deposited overlying the second dielectric layer and covering the sidewalls of the stack. The thickness of this amorphous silicon layer should be one-half of the desired thickness of the sidewall spacer 58 of FIG. 13. This amorphous silicon layer is then etched to form a remaining amorphous silicon portion 56 using reactive ion etching (RIE) techniques as illustrated in FIG. 12. The advantage of this etch is the high selectivity of etching silicon relative to the underlying oxide or nitride layers. The remaining amorphous silicon portion 56 is then thermally oxidized to form an inflatable thermal silicon dioxide spacer 58 as shown in FIG. 13. The reoxidized silicon will increase in thickness by approximately a factor of two. Following the spacer formation, the N+ and P+ source-drain implants (not shown) can be done. These polyoxide spacers could be left in place around the gate. Alternatively, the spacers could be removed using HF acid, since the underlying nitride is largely resistant to the etch solution. Subsequently, the N– and P– implants can now be done to form the LDD junctions in the substrate, if this step has not already been performed prior to the amorphous silicon deposition. Alternatively, some LDD implants can be done before inflating the spacer, while others can be done after inflating the spacer, thus allowing the formation of dual LDD profiles with a single spacer.

The foregoing description and illustrations contained herein demonstrate many of the advantages associated with the present invention. In particular, it has been revealed that the amorphous silicon layer is largely resistant to HF acid solutions that are used to clean the substrate prior to the second gate oxide formation. The oxidized amorphous silicon produces an ONO dielectric stack with a thick top oxide concurrently with the formation of a second gate oxide. Furthermore, this top ONO oxide thickness is determined by the amorphous silicon layer thickness and is independent of the second gate oxide thickness. Use of the amorphous silicon layer reduces the susceptibility to punch-though of the underlying nitride layer. Additionally, the amorphous silicon layer can be etched to form a spacer that is subsequently oxidized to form an inflatable spacer. Another advantage is that reoxidizing amorphous silicon forms a high density top oxide layer thus eliminating the need for a subsequent annealing or densification step.

Thus it is apparent that there has been provided, in accordance with the invention, a method for forming concurrent top oxides and for forming inflatable sidewall spacers using reoxidized amorphous silicon that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, either nitride, oxynitride, or other oxidation resistant materials, such as $Al_2O_3$, may be used for the dielectric/oxidation stop layer. In addition, the invention is not limited to any particular range of amorphous silicon thickness as thinner or thicker layers may be suitable for different applications. It is also important to note that the present invention is not limited in any way to any particular method of depositing the amorphous silicon layer as LPCVD, plasma deposition or remote plasma deposition techniques may be used. Additionally, use of polycrystalline silicon in place of amorphous silicon may be possible. Furthermore, oxidation techniques other than thermal, such as plasma or chemical oxidation, may be used in practicing the invention. Therefore, it is intended that this invention encompass all such variations and modifications falling within the scope of the appended claims.

We claim:

1. A method for forming a semiconductor device, comprising the steps of:

providing a semiconductor substrate;

forming a silicon layer overlying the semiconductor substrate;

forming a first dielectric layer overlying the silicon layer;

forming a second dielectric layer overlying the first dielectric layer;

forming an amorphous silicon layer overlying the second dielectric layer;

etching the amorphous silicon layer to form a patterned amorphous silicon layer;

forming an exposed portion of the semiconductor substrate, wherein the exposed portion of the semiconductor substrate is formed after the patterned amorphous silicon layer been formed; and thermally oxidizing the patterned amorphous silicon layer to convert the patterned amorphous silicon layer into a thermal oxide layer overlying a portion of the second dielectric layer and thermally oxidizing the exposed portion of the semiconductor substrate to form a first gate dielectric layer, wherein the patterned amorphous silicon layer and the exposed portion of the semiconductor substrate are thermally oxidized at the same time.

2. The method of claim 1, wherein the step of forming the first dielectric layer comprises oxidizing a top surface of the silicon layer to form silicon dioxide.

3. The method of claim 1, wherein the step of forming the second dielectric layer is performed through chemical vapor deposition of a silicon nitride layer.

4. The method of claim 1, wherein the step of forming the silicon layer is further characterized as forming a polysilicon layer.

5. The method of claim 1, wherein the step of thermally oxidizing the amorphous silicon layer is performed at a temperature lower than an oxidation temperature of the second dielectric layer.

6. A method for forming a semiconductor device, comprising the steps of:

providing a semiconductor substrate; forming a floating gate overlying the semiconductor substrate;

forming a first oxide layer overlying the floating gate;

forming a nitride layer overlying the first oxide layer;

forming an amorphous silicon layer overlying the nitride layer;

etching the amorphous silicon layer to form a patterned amorphous silicon layer;

forming an exposed portion of the semiconductor substrate, wherein the exposed portion of the semiconductor substrate is formed after the patterned amorphous silicon layer has been formed; and thermally oxidizing the patterned amorphous silicon layer to convert the patterned amorphous silicon layer into a second oxide layer overlying the nitride layer and thermally oxidizing the exposed portion of the semiconductor substrate to form a first gate dielectric layer, wherein the patterned amorphous silicon layer and the exposed portion of the semiconductor substrate are thermally oxidized at the same time.

7. The method of claim 6, wherein the step of thermally oxidizing the amorphous silicon layer is performed at a temperature lower than an oxidation temperature of the nitride layer.

8. The method of claim 6, wherein the step of thermally oxidizing the amorphous silicon layer forms the second oxide layer having a thickness ranging from about 30 to about 1000 angstroms.

9. The method of claim 6, wherein the step of forming the nitride layer forms the nitride layer having a thickness ranging from about 60 to about 200 angstroms.

10. The method of claim 6, wherein the step of thermally oxidizing the amorphous silicon layer is performed at a temperature ranging from about 700° to about 1050° C.

11. The method of claim 6, wherein the step of forming the first oxide layer forms the first oxide layer having a thickness ranging from about 50 to about 200 angstroms.

12. The method of claim 6, wherein the step of forming the floating gate comprises the step of depositing a polysilicon layer.

13. The method of claim 6, wherein the step of forming the first oxide layer comprises the step of depositing an oxide layer.

14. The method of claim 1, wherein the step of forming the silicon layer is further characterized as forming a patterned silicon layer.

15. The method of claim 1, further comprising the step of forming a tunnel oxide overlying the semiconductor substrate, wherein the tunnel oxide underlies the silicon layer.

16. The method of claim 1, further comprising the step of forming a second gate dielectric overlying the semiconductor substrate, wherein the second gate dielectric layer underlies the silicon layer.

17. The method of claim 1, wherein the step of thermally oxidizing the patterned amorphous silicon layer and the exposed portion of the semiconductor substrate, the thermal oxide layer is further characterized as having a first thickness and the first gate dielectric layer is further characterized as having a second thickness, wherein the first thickness is not equal to the second thickness.

18. The method of claim 6, further comprising the step of forming a tunnel oxide overlying the semiconductor substrate, wherein the tunnel oxide underlies the floating gate.

19. The method of claim 6, further comprising the step of forming a second gate dielectric layer overlying the semiconductor substrate, wherein the second gate dielectric layer underlies the floating gate.

20. The method of claim 6, wherein the step of thermally oxidizing the patterned amorphous silicon layer and the exposed portion of the semiconductor substrate, the second oxide layer is further characterized as having a first thickness and the first gate dielectric layer is further characterized as having a second thickness, wherein the first thickness is not equal to the second thickness.

* * * * *